United States Patent
Li

(10) Patent No.: US 7,327,194 B2
(45) Date of Patent: Feb. 5, 2008

(54) LOW VOLTAGE LOW POWER CLASS A/B OUTPUT STAGE

(75) Inventor: Chin Sing Li, Hong Kong (HK)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 11/290,286

(22) Filed: Nov. 30, 2005

(65) Prior Publication Data

US 2007/0120604 A1    May 31, 2007

(51) Int. Cl.
*H03F 3/26* (2006.01)
(52) U.S. Cl. ...................................... 330/264
(58) Field of Classification Search ................. 330/264
See application file for complete search history.

(56) References Cited

U.S. PATENT DOCUMENTS

| | | | |
|---|---|---|---|
| 4,570,128 A | | 2/1986 | Monticelli |
| 5,442,320 A | * | 8/1995 | Kunst et al. ............... 330/267 |
| 5,659,266 A | * | 8/1997 | Shacter et al. ............. 330/267 |
| 5,786,731 A | * | 7/1998 | Bales ........................ 330/267 |
| 5,900,783 A | * | 5/1999 | Dasgupta .................... 330/264 |
| 6,078,220 A | * | 6/2000 | Bales ........................ 330/264 |
| 6,545,538 B1 | * | 4/2003 | Ivanov et al. ............... 330/255 |
| 7,049,894 B1 | * | 5/2006 | Aram ........................ 330/296 |
| 7,071,769 B1 | * | 7/2006 | Aram ........................ 327/543 |
| 7,075,361 B1 | * | 7/2006 | Aram ........................ 327/543 |
| 7,116,172 B2 | * | 10/2006 | Siniscalchi ................. 330/260 |
| 7,208,998 B2 | * | 4/2007 | Abel ......................... 327/538 |
| 2006/0113982 A1 | * | 6/2006 | Plojhar ...................... 323/315 |

OTHER PUBLICATIONS

Crawley et al Designing Operational Transconductance Amplifiers for Low Voltage Operation Dept. of Electrical Engineering, McGill University/ Montreal,PQ, Canada, 1993, pp. 1455-1458.
You et al Low Voltage Class AB Buffers with Quiescent Current Control IEEE Journal of Solid-State Circuits vol. 33 No. 6 Jun. 1998 pp. 915-920.
Dennis M. Monticelli, A Quad CMOS Single-Supply Opamp with Rail-to-Rail Output Swing ISSCC 86/Santa Clara, CA, Feb. 19, 1986, pp. 18-19 and 287.

* cited by examiner

*Primary Examiner*—Robert J. Pascal
*Assistant Examiner*—Krista M Flanagan
(74) *Attorney, Agent, or Firm*—Charles Bergere

(57) ABSTRACT

A CMOS class A/B output stage provides the advantages of high speed operation, low supply voltage requirements, and low quiescent current draw, resulting from the use of sub-threshold biasing of the output driver transistors. The architecture of the output stage makes it particularly suitable for use in operational amplifiers in power demanding applications, such as portable instruments, smoke detectors, sensors, or the like.

19 Claims, 3 Drawing Sheets

LOW VOLTAGE LOW POWER CLASS A/B OUTPUT STAGE

BACKGROUND OF THE INVENTION

The present invention relates generally to electronic circuits. More particularly, the present invention relates to a class A/B amplifier output stage.

Class A/B amplifier output stages are commonly used in practical applications having low operating power and low operating voltage requirements. For example, such class A/B output stages may be used in operational amplifiers for mobile devices, smoke detectors, sensors, portable instruments, and the like. The design of a class A/B output stage plays a significant role in the overall driving ability, power consumption, and operating voltage of the circuit. Developers often utilize Monticelli's class A/B output stage in low voltage, low power operational amplifier designs. FIG. 1 is a circuit diagram of a class A/B output stage 100 that incorporates the Monticelli design. In accordance with conventional techniques, the input signal(s) are fed into the output stage 100 as small signal current through the current sources (labeled $I_{B1}$). Although this design is widely used, the minimum supply voltage (VDD) for output stage 100 is: VDD=2VT+3VDS$_{sat}$, where VT is the threshold voltage for the output driver transistors and VDS$_{sat}$ is the drain-to-source voltage at saturation for the output driver transistors. In this context, $$VDS_{sat} = \sqrt{\frac{2I}{\mu Cox\left(\frac{W}{L}\right)}} = \Delta V.$$

In this expression, I is the bias current, μ is the electron/hole mobility, Cox is the oxide capacitance, W is the transistor channel width, and L is the transistor channel length. For the sake of simplicity, VDS$_{sat}$ is denoted as ΔV for reference.

The Monticelli output stage uses a cascode translinear loop to control output driver quiescent current, in which the transistors in the loop must be biased in the saturation region. The quiescent current is controlled by the current mirror ratio associated with the translinear loop formation, where a moderate amount of quiescent current is inevitably needed because the transistors, including the output driver transistors, are biased in the saturation region. In FIG. 1, transistors M1-M4 form one translinear loop, and transistors M5-M8 form another translinear loop. In this regard, $$I_q = \left(\frac{W}{L}\right)_4 \bigg/ \left(\frac{W}{L}\right)_1 I_{B1} = \left(\frac{W}{L}\right)_8 \bigg/ \left(\frac{W}{L}\right)_6 I_{B1},$$

where $$\left(\frac{W}{L}\right)_2 = \left(\frac{W}{L}\right)_3 \text{ and } \left(\frac{W}{L}\right)_5 = \left(\frac{W}{L}\right)_7.$$

In these expressions, $I_q$ is the quiescent current of the Monticelli output stage and $$\left(\frac{W}{L}\right)_n$$

is the aspect ratio of the channel width to the channel length of transistor $M_n$.

Accordingly, it is desirable to have a class A/B output stage that provides high speed operation (simplicity without feedback), has low minimum operating voltage requirements, and draws little quiescent current during normal operation. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION OF THE INVENTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques related to CMOS circuits, transistor operation and biasing, current supplies, voltage supplies, and other functional aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element and two or more signals can be multiplexed, modulated, or otherwise distinguished even though received or output at a common node.

The following description refers to nodes or features being "connected" or "coupled" together. As used herein, unless expressly stated otherwise, "connected" means that one node/feature is directly joined to or directly communicates with another node/feature, and not necessarily mechanically. Likewise, unless expressly stated otherwise, "coupled" means that one node/feature is directly or indirectly joined to or directly or indirectly communicates with another node/feature, and not necessarily mechanically. Thus, although the schematics shown in the figures depict example arrangements of elements, additional intervening elements, devices, features, or components may be present in an actual embodiment (assuming that the functionality of the circuits are not adversely affected).

Figure 2:
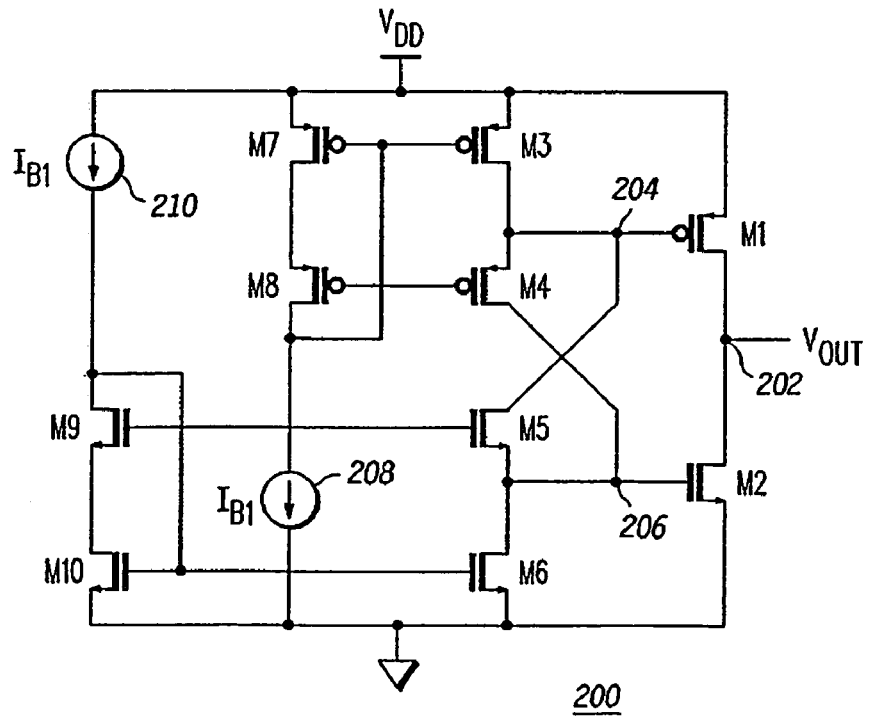
FIG. 2 is a circuit diagram of a class A/B output stage configured in accordance with an example embodiment of the present invention.

FIG. 2 is a circuit diagram of a class A/B output stage 200 configured in accordance with an example embodiment of the present invention. The output stage 200 generally includes a number of PMOS transistors (labeled M1, M3, M4, M7, and M8) and a number of NMOS transistors (labeled M2, M5, M6, M9, and M10) arranged to generate an output voltage (labeled $V_{out}$) at an output node 202. The input signal(s) are fed into the output stage 200 as small signal current through current source(s) 208 and 210. Although the output stage 200 uses CMOS transistor technology, practical embodiments of the invention may use other transistor types and technologies in an equivalent manner. The output stage 200 preferably operates with a low voltage source or supply (labeled VDD), which may provide a nominal voltage of about 1.5 to 1.8 volts in a practical implementation.

Each of the transistors M1-M10 has a source, a gate, and a drain, and FIG. 2 depicts these transistors using traditional NMOS and PMOS transistor symbols. In this example embodiment, transistor M1 functions as a first output driver transistor, transistor M2 functions as a second output driver transistor, transistors M3 and M4 form a first high swing cascode structure, transistors M5 and M6 form a second high swing cascode structure, and transistors M7-M10 form a biasing architecture for the output stage 200. In this regard, transistors M7 and M8 are PMOS bias transistors and transistors M9 and M10 are NMOS bias transistors, and the biasing architecture is coupled to the first and second high swing cascode structures. Transistors M7 and M8 form a first current mirror structure, which is coupled to the first high swing cascode structure, and transistors M9 and M10 form a second current mirror structure, which is coupled to the second high swing cascode structure.

The source of transistor M1 is coupled to the supply voltage (VDD), the gate of transistor M1 corresponds to a node 204, and the drain of transistor M1 is coupled to the output node 202. The source of transistor M2 is coupled to a reference voltage, such as a ground potential, the gate of transistor M2 corresponds to a node 206, and the drain of transistor M2 is coupled to the output node 202. Thus, the drain of transistor M2 is also coupled to the drain of transistor M1.

Transistor M3 is a PMOS cascode transistor in this example embodiment. The source of transistor M3 is coupled to VDD, the gate of transistor M3 is coupled to the gate of transistor M7 and to the drain of transistor M8, and the drain of transistor M3 is coupled to the node 204. Transistor M4 is also a PMOS cascode transistor in this example embodiment. The source of transistor M4 is coupled to the node 204, the gate of transistor M4 is coupled to the gate of transistor M8, and the drain of transistor M4 is coupled to the node 206. Thus, the drain of transistor M3 is coupled to the source of transistor M4. Notably, the high swing cascode structure formed by transistors M3 and M4 is coupled to both of the output driver transistors M1 and M2.

Transistor M6 is an NMOS cascode transistor in this example embodiment. The source of transistor M6 is coupled to the reference voltage (ground potential), the gate of transistor M6 is coupled to the gate of transistor M10 and to the drain of transistor M9, and the drain of transistor M6 is coupled to the node 206. Transistor M5 is also an NMOS cascode transistor in this example embodiment. The source of transistor M5 is coupled to the node 206, the gate of transistor M5 is coupled to the gate of transistor M9, and the drain of transistor M5 is coupled to the node 204. Thus, the drain of transistor M6 is coupled to the source of transistor M5. In this example, the source of transistor M5 corresponds to the node 206 and the drain of transistor M5 corresponds to the node 204. Notably, the high swing cascode structure formed by transistors M5 and M6 is coupled to both of the output driver transistors M1 and M2.

Transistor M7 is a PMOS bias transistor in this example embodiment. The source of transistor M7 is coupled to VDD, the gate of transistor M7 is coupled to the gate of transistor M3 and to the drain of transistor M8, and the drain of transistor M7 is coupled to the source of transistor M8. Transistor M8 is also a PMOS bias transistor in this example embodiment. The source of transistor M8 is coupled to the drain of transistor M7, the gate of transistor M8 is coupled to the gate of transistor M4, and the drain of transistor M8 is coupled to the gate of transistor M7, to the gate of transistor M3, and to a current source 208. In this example, the source of transistor M8 is connected to the drain of transistor M7, the gate of transistor M8 is connected to the gate of transistor M4, and the drain of transistor M8 is connected to the gates of transistors M7 and M3, and to the current source 208.

Transistor M10 is an NMOS bias transistor in this example embodiment. The source of transistor M10 is coupled to the reference voltage (ground potential), the gate of transistor M10 is coupled to the gate of transistor M6 and to the drain of transistor M9, and the drain of transistor M10 is coupled to the source of transistor M9. Transistor M9 is also an NMOS bias transistor in this example embodiment. The source of transistor M9 is coupled to the drain of transistor M10, the gate of transistor M9 is coupled to the gate of transistor M5, and the drain of transistor M9 is coupled to the gate of transistor M10, to the gate of transistor M6, and to the current source 210.

The current source 208, which is coupled between transistor M8 and the reference voltage, provides a first bias current for transistor M7 and transistor M8. The current source 210, which is coupled between transistor M9 and VDD, provides a second bias current for transistor M9 and transistor M10. In the preferred embodiment, the first bias current is equal to the second bias current to enable symmetrical operation of the output stage 200. In practice, the current sources 208 and 210 may be realized as a high impedance node with bias current pass through.

In a practical embodiment, a voltage source provides a minimum operating voltage of $3VDS_{sat}$, where $VDS_{sat}$ is the drain-to-source voltage at saturation for the output driver transistors. VDD need only be greater than $3VDS_{sat}$ because the output stage employs the high swing cascode structures, in which VGS (the gate-to-source voltage) of the transistors is biased higher than VDS (the drain-to-source voltage) of the transistors, and just before entering the triode region, i.e., $VGS=VDS_{sat}+VT$. In addition, the quiescent current, $I_q$, is controlled by the gate voltage (VGS) of the output driver transistors via adjustment of the gate voltage (VGS) of transistors M4 and M5. This quiescent current control technique is used in lieu of adjustment of the current mirror ratio so that the output driver transistors are biased into the subthreshold operating region, which lowers the quiescent current while maintaining the drive strength. In the example embodiment, the biasing architecture is suitably configured and controlled to bias each of the cascode transistors, and each of the output driver transistors, into its respective subthreshold operating region. As a result, the overdrive voltage for the output driver transistors equals VDD-VT-2VDS$_{sat}$, where VT is the threshold voltage for the output driver transistors. The operating characteristics of the output stage 200 are derived from the following expressions:

$$VGS_{M2} = 2\Delta V - \sqrt{\frac{2I_{M5}}{\mu Cox\left(\frac{W}{L}\right)_5}} \text{; where:}$$

$$\left(\frac{W}{L}\right)_7 = \left(\frac{W}{L}\right)_8 = \left(\frac{W}{L}\right)_3 \text{ and } \left(\frac{W}{L}\right)_6 = \left(\frac{W}{L}\right)_9 = \left(\frac{W}{L}\right)_{10}.$$

Let $I_{M5}=\alpha I_{B1}$ and $I_{M4}=(1-\alpha)I_{B1}$, where $\alpha<1$. Then, $$VGS_{M2} = \Delta V\left(2 - \sqrt{\frac{\alpha\left(\frac{W}{L}\right)_9}{\left(\frac{W}{L}\right)_5}}\right).$$

With $VGS_{M2}\approx VT$, $$I_q = I_o \exp\left(\frac{VDS_{M2} - VT}{nV_{th}}\right);$$

where:

$I_o$ is the drain current when VGS=VT;

n is the subthreshold slope factor (one is ideal); and $V_{th}$ is the thermal voltage, KT/q. In this expression, K is Boltzman's constant, T is temperature, and q is electron charge.

Figure 1:
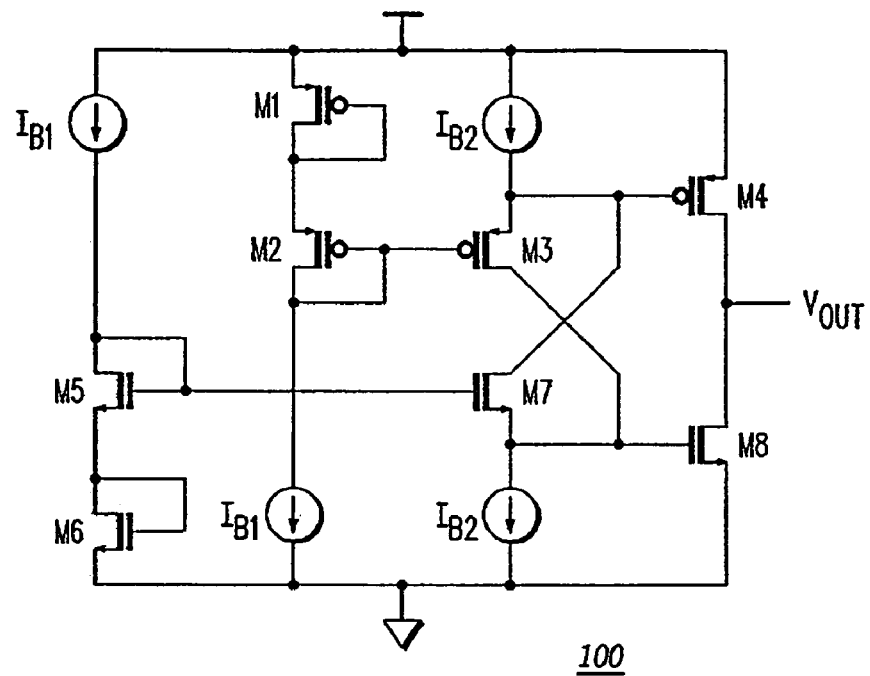
FIG. 1 is a circuit diagram of a prior art class A/B output stage.

Table 1 below compares several operating characteristics of the output stage 200 to an output stage that incorporates the Monticelli design (such as the output stage 100 depicted in FIG. 1).

TABLE 1

Output Stage Comparison

|  | Output Stage 100 (Monticelli) | Output Stage 200 |
|---|---|---|
| Minimum VDD | 2VT + 3VDS$_{sat}$ | 3VDS$_{sat}$ |
| Overdrive Voltage (at output drivers) | VDD − 2VT − 2VDS$_{sat}$ | VDD − VT − 2VDS$_{sat}$ |
| Quiescent Current (same output driver size) | Moderate (saturation) | Low (subthreshold) |

Figure 3:
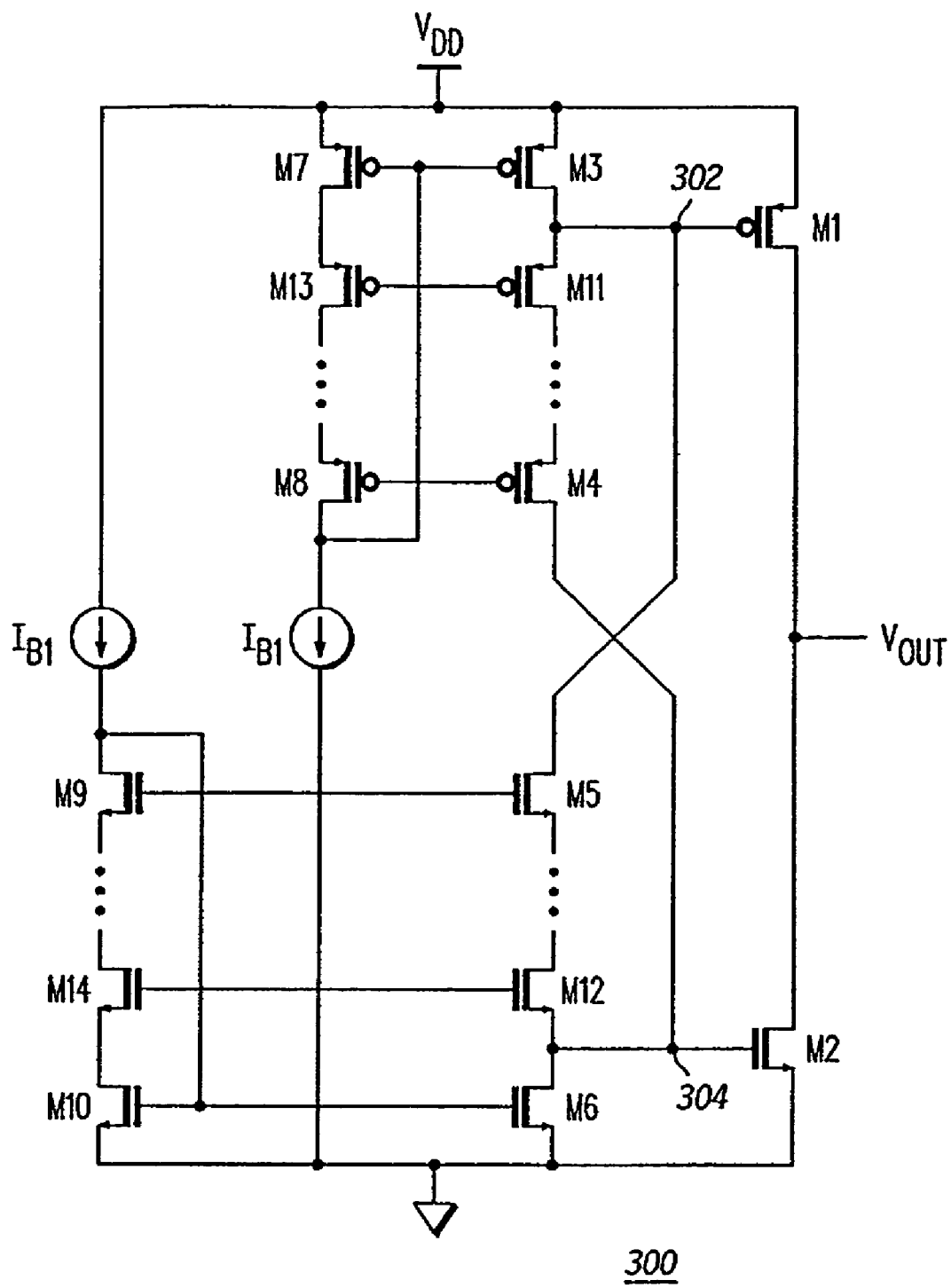
FIG. 3 is a circuit diagram of a class A/B output stage configured in accordance with an alternate embodiment of the present invention.

A class A/B output stage may include more than two "levels" of cascode transistors and bias transistors as shown in FIG. 2. In this regard, FIG. 3 is a circuit diagram of a class A/B output stage 300 configured in accordance with an alternate embodiment of the present invention. The output stage 300 has a number of features and elements in common with the output stage 200. For the sake of brevity, such common features, elements, and operating characteristics will not be described again in connection with output stage 300. For consistency with the above description of the output stage 200, FIG. 3 identifies transistors M1-M10, which correspond to the same numbered transistors in FIG. 2.

The basic architecture of the output stage 300 is similar to that utilized by the output stage 200. The output stage 300, however, includes an additional PMOS cascode transistor (labeled M11), an additional NMOS cascode transistor (labeled M12), an additional PMOS bias transistor (labeled M13), and an additional NMOS bias transistor (labeled M14). The source of transistor M11 is coupled to the drain of transistor M3, to the drain of transistor M5, and to a node 302. The gate of transistor M11 is coupled to the gate of transistor M13, and the drain of transistor M11 is coupled to the source of transistor M4. In this example embodiment, the source of transistor M11 corresponds to the node 302, which is connected to the drain of transistor M3 and to the drain of transistor M5. If only three cascode transistors are utilized in this section of the output stage 300, then the drain of transistor M11 may be connected to the source of transistor M4.

The source of transistor M12 is coupled to the drain of transistor M6, to the drain of transistor M4, and to a node 304. The gate of transistor M12 is coupled to the gate of transistor M14, and the drain of transistor M12 is coupled to the source of transistor M5. In this example embodiment, the source of transistor M12 corresponds to node 304, which is connected to the drain of transistor M6 and to the drain of transistor M4. If only three cascode transistors are utilized in this section of output stage 300, then the drain of transistor M12 may be connected to the source of transistor M5.

The source of transistor M13 is coupled to the drain of transistor M7, the gate of transistor M13 is coupled to the gate of transistor M11, and the drain of transistor M13 is coupled to the source of transistor M8. If only three bias transistors are utilized in this section of the output stage 300, then the drain of transistor M13 may be connected to the source of transistor M8.

The source of transistor M14 is coupled to the drain of transistor M10, the gate of transistor M14 is coupled to the gate of transistor M12, and the drain of transistor M14 is coupled to the source of transistor M9. If only three bias transistors are utilized in this section of output stage 300, then the drain of transistor M14 may be connected to the source of transistor M9.

The additional transistors in the output stage 300 increase the gain of the output stage 300 at the expense of increased quiescent current and increased supply voltage requirements. To maintain operating symmetry, the same number of additional PMOS cascode transistors, NMOS cascode transistors, PMOS bias transistors, and NMOS bias transistors are utilized. The ellipses in FIG. 3, however, illustrate that the output stage 300 need not employ only one additional transistor in the identified sections.

Figure 4:
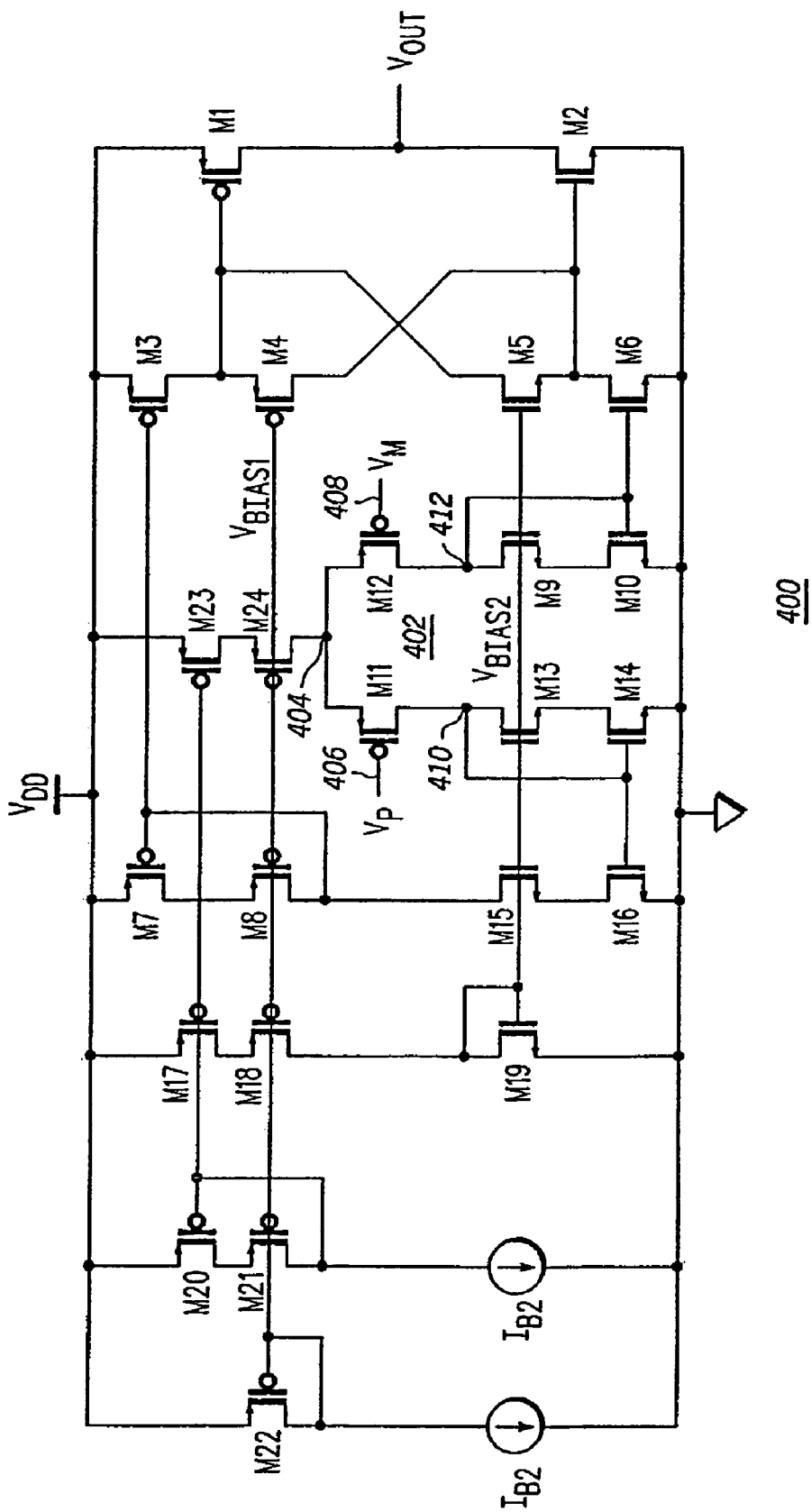
FIG. 4 is a circuit diagram of an operational amplifier configured in accordance with an example embodiment of the present invention.

A class A/B output stage as described above may be utilized in a number of practical electronic circuits. In this regard, FIG. 4 is a circuit diagram of an operational amplifier 400 configured in accordance with an example embodiment of the present invention. The operational amplifier 400 has a number of features and elements in common with the output stage 200 described above. For the sake of brevity, such common features, elements, and operating characteristics will not be described again. For consistency with the above description of the output stage 200, FIG. 4 identifies transistors M1-M10, which, to the extent possible, correspond to the same numbered transistors in FIG. 2.

The arrangement of transistors M1-M6 in the operational amplifier 400 is identical to the arrangement of transistors M1-M6 in the output stage 200. Transistors M1 and M2 serve as output driver transistors for the operational amplifier 400. As shown in FIG. 4, the gate of transistor M3 is coupled to the gate of transistor M7, and the gate of transistor M4 is coupled to the gate of transistor M8. Transistors M7 and M8 are PMOS bias transistors that form a current mirror architecture for biasing transistors M3 and M4 in the manner described above. In lieu of the current source 208 shown in FIG. 2, the operational amplifier 400 employs transistors M15 and M16 to provide a bias current for transistors M7 and M8. As shown in FIG. 4, the gate of transistor M5 is coupled to the gate of transistor M9, and the gate of transistor M6 is coupled to the gate of transistor M10. Transistors M9 and M10 are NMOS bias transistors that form a current mirror architecture for biasing transistors M5 and M6 in the manner described above. In lieu of the current source 210 shown in FIG. 2, the operational amplifier 400 employs transistors M11, M12, M23, and M24 to provide a bias current for transistors M9 and M10.

The operational amplifier 400 includes a differential transistor pair 402 (including PMOS transistors M11 and M12) having a common source node 404, a first gate node 406 for the positive component of the input signal, a second gate node 408 for the negative component of the input signal, a first drain node 410, and a second drain node 412. The common source node 404 may be coupled to a current source, which is realized as the cascode combination of transistors M23 and M24 in this example. In this practical implementation, the common source node 404 corresponds to the source of transistor M11 and also corresponds to the source of transistor M12. In addition, first gate node 406 corresponds to the gate of transistor M11, second gate node 408 corresponds to the gate of transistor M12, first drain node 410 corresponds to the drain of transistor M11, and second drain node 412 corresponds to the drain of transistor M12.

The drain of transistor M11 is coupled to the drain of transistor M13, to the gate of transistor M14, and to the gate of transistor M16. In this example, the drain of transistor M11 is connected to the drain of transistor M13, to the gate of transistor M14, and to the gate of transistor M16. Likewise, the drain of transistor M12 is coupled to the drain of transistor M9, to the gate of transistor M10, and to the gate of transistor M6. In this example, the drain of transistor M12 is connected to the drain of transistor M9, to the gate of transistor M10, and to the gate of transistor M6.

In operation, appropriate values for $V_{bias1}$ and $V_{bias2}$ (the voltages at the gates of the M4 and M5 transistors, respectively) are set to bias the transistors to $VGS \approx VDS_{sat} + VT$. In other words, the gate voltage of transistor M5 with respect to VSS equals $2\Delta V$ and the gate voltage of transistor M4 with respect to VDD equals $2\Delta V$. Again, $VGS_{M1}$ and $VGS_{M2}$ follow the equations set forth above. Thus, to set the output drivers into the subthreshold region, two conditions must be met: (1) set transistor M4 and transistor M5 with $VGS \approx VDS_{sat} + VT$ through $V_{bias1}$ and $V_{bias2}$; and (2) adjust $VGS_{M1}$ and $VGS_{M2}$ using the expressions set forth above in connection with the description of the output stage 200. In this manner, the output driver transistors are set into the subthreshold region so that low quiescent current can be achieved without devoting their driving strength through size reduction. The values for $V_{bias1}$ and $V_{bias2}$ can be generated by a biasing circuit (e.g., transistors M17-M22)

with optimization. In the operational amplifier 400, for example, this can be set by having the channel length of transistor M19 be five times the channel length of transistor M15, and by having the channel length of transistor M22 be five times the channel length of transistor M21. Moreover, the compact design, which lacks feedback, is simple to implement and it provides good stability for high speed operation. A simulation revealed that a practical operational amplifier 400 can be operated with loads at a minimum single supply voltage (VDD) of 1.5 volts. If VDD is increased to 5.0 volts, the no-load current is only 50 µA, with DC gain equal to 87 dB; output short circuit current can be up to ±20 mA. In addition, 6 MHz gain bandwidth product was achieved with phase margin of 62 degrees. Table 2 below summarizes the performance of a typical operational amplifier that incorporates the output stage described above. The results in Table 2 are based upon a VDD of 5.0 volts and a temperature of 25° C.

TABLE 2

Operational Amplifier Performance

| Characteristics | Results |
| --- | --- |
| DC Gain (no load) | 87 dB |
| DC Gain (with $R_L$ = 100 kΩ, $C_L$ = 50 pF) | 77 dB |
| I/P Offset Voltage | <±5 mV |
| Common Mode I/P Voltage Range | [0, VDD − 1.2 V] |
| O/P Swing | [VSS + 100 mV, VDD − 100 mV] |
| Quiescent Current | 50 µA |
| O/P Short Circuit Current | ±20 mA |
| Phase Margin | 62 degrees |
| Gain Bandwidth Product | 5.9 MHz |
| Common Mode Rejection Ratio | 132 dB |
| PSRR+ | 77 dB |
| PSRR− | 75 dB |
| Equivalent O/P Noise | <400 nV/$\sqrt{Hz}$ |
| Equivalent I/P Noise | <50 nV/$\sqrt{Hz}$ |
| Slew Rate | 4.2 V/µs |
| Total Harmonic Distortion @ 1 kHz | <0.3% |

The class A/B amplifier output stage described above lowers the minimum operating voltage of the traditional Monticelli design to only $3VDS_{sat}$, and also reduces the quiescent current without reducing driving strength. The output stage has a compact and simple architecture, resulting in good stability for practical implementations. When incorporated into an operational amplifier, the output stage enhances the speed of the operational amplifier in terms of gain bandwidth product.

In summary, systems, devices, and methods configured in accordance with example embodiments of the invention relate to: a class A/B amplifier output stage including a first output driver transistor having a source, a gate, and a drain; a second output driver transistor having a source, a gate, and a drain, the drain of said first output driver transistor being coupled to the drain of said second output driver transistor; a first high swing cascode structure coupled to said first output driver transistor and to said second output driver transistor; a second high swing cascode structure coupled to said first output driver transistor and to said second output driver transistor; said first high swing cascode structure and said second high swing cascode structure being configured to bias said first output driver transistor into its subthreshold operating region, and to bias said second output driver transistor into its subthreshold operating region. The output stage may further comprise a voltage source coupled to said first high swing cascode structure, said voltage source providing a minimum operating voltage of $3VDS_{sat}$, where VDS$_{sat}$ is the drain-to-source voltage at saturation for said first output driver transistor and said second output driver transistor. In one embodiment the voltage source provides an operating voltage of VDD, and overdrive voltage for said first output driver transistor and for said second output driver transistor equals VDD-VT-2VDS$_{sat}$, where VT is the threshold voltage for said first output driver transistor and said second output driver transistor. The output stage may further include a biasing architecture coupled to said first high swing cascode structure and said second high swing cascode structure, wherein the first high swing cascode structure includes a first plurality of cascode transistors; said second high swing cascode structure comprises a second plurality of cascode transistors; and said biasing architecture is configured to bias each of said first plurality of cascode transistors and each of said second plurality of cascode transistors into its respective subthreshold operating region. The output stage may further comprise a first current mirror structure coupled to said first high swing cascode structure, and a second current mirror structure coupled to said second high swing cascode structure. The first current mirror structure may comprise a first current mirror transistor having a source, a gate, and a drain, and a second current mirror transistor having a source, a gate, and a drain, the gate of said first current mirror transistor being coupled to the drain of said second current mirror transistor; and the second current mirror structure may comprise a third current mirror transistor having a source, a gate, and a drain, and a fourth current mirror transistor having a source, a gate, and a drain, the gate of said fourth current mirror transistor being coupled to the drain of said third current mirror transistor.

A class A/B amplifier output stage including a PMOS output driver transistor having a source, a gate, and a drain; an NMOS output driver transistor having a source, a gate, and a drain, the drain of said PMOS output driver transistor being coupled to the drain of said NMOS output driver transistor; a first PMOS cascode transistor having a source, a gate, and a drain, the drain of said first PMOS cascode transistor being coupled to the gate of said PMOS output driver transistor; a first NMOS cascode transistor having a source, a gate, and a drain, the drain of said first NMOS cascode transistor being coupled to the gate of said NMOS output driver transistor; a final PMOS cascode transistor having a source, a gate, and a drain, the drain of said final PMOS cascode transistor being coupled to the gate of said NMOS output driver transistor; a final NMOS cascode transistor having a source, a gate, and a drain, the drain of said final NMOS cascode transistor being coupled to the gate of said PMOS output driver transistor; a first PMOS bias transistor having a source, a gate, and a drain, the gate of said first PMOS bias transistor being coupled to the gate of said first PMOS cascode transistor; a first NMOS bias transistor having a source, a gate, and a drain, the gate of said first NMOS bias transistor being coupled to the gate of said first NMOS cascode transistor; a final PMOS bias transistor having a source, a gate, and a drain, the gate of said final PMOS bias transistor being coupled to the gate of said final PMOS cascode transistor, and the drain of said final PMOS bias transistor being coupled to the gate of said first PMOS bias transistor; and a final NMOS bias transistor having a source, a gate, and a drain, the gate of said final NMOS bias transistor being coupled to the gate of said final NMOS cascode transistor, and the drain of said final NMOS bias transistor being coupled to the gate of said first NMOS bias transistor. The source of said PMOS output driver transistor may be coupled to a supply voltage; the source of said first PMOS cascode transistor may be coupled to said supply voltage; the source of said first PMOS bias transistor may be coupled to said supply voltage; the source of said NMOS output driver transistor may be coupled to a ground potential; the source of said first NMOS cascode transistor may be coupled to said ground potential; and the source of said first NMOS bias transistor may be coupled to said ground potential. The drain of said first PMOS cascode transistor may be coupled to the source of said final PMOS cascode transistor; and the drain of said first NMOS cascode transistor may be coupled to the source of said final NMOS cascode transistor. The drain of said first PMOS bias transistor may be coupled to the source of said final PMOS bias transistor; and the drain of said first NMOS bias transistor may be coupled to the source of said final NMOS bias transistor. The output stage may further comprise a first current source coupled to said final PMOS bias transistor, said first current source being configured to provide a first bias current for said first PMOS bias transistor and for said final PMOS bias transistor; and a second current source coupled to said final NMOS bias transistor, said second current source being configured to provide a second bias current for said first NMOS bias transistor and for said final NMOS bias transistor. The first bias current can be equal to said second bias current. The output stage may further include an additional PMOS cascode transistor having a source, a gate, and a drain, the source of said additional PMOS cascode transistor being coupled to the drain of said first PMOS cascode transistor, and the drain of said additional PMOS cascode transistor being coupled to the source of said final PMOS cascode transistor; and an additional NMOS cascode transistor having a source, a gate, and a drain, the source of said additional NMOS cascode transistor being coupled to the drain of said first NMOS cascode transistor, and the drain of said additional NMOS cascode transistor being coupled to the source of said final NMOS cascode transistor. The output stage may further include an additional PMOS bias transistor having a source, a gate, and a drain, the source of said additional PMOS bias transistor being coupled to the drain of said first PMOS bias transistor, the gate of said additional PMOS bias transistor being coupled to the gate of said additional PMOS cascode transistor, and the drain of said additional PMOS bias transistor being coupled to the source of said final PMOS bias transistor; and an additional NMOS bias transistor having a source, a gate, and a drain, the source of said additional NMOS bias transistor being coupled to the drain of said first NMOS bias transistor, the gate of said additional NMOS bias transistor being coupled to the gate of said additional NMOS cascode transistor, and the drain of said additional NMOS bias transistor being coupled to the source of said final NMOS bias transistor.

The present invention also is an electronic circuit having a first output driver transistor having a source, a gate, and a drain; a second output driver transistor having a source, a gate, and a drain, the drain of said first output driver transistor being coupled to the drain of said second output driver transistor; a first cascode transistor having a source, a gate, and a drain, the drain of said first cascode transistor being coupled to the gate of said second output driver transistor; a second cascode transistor having a source, a gate, and a drain, the drain of said second cascode transistor being coupled to the gate of said first output driver transistor; a first bias transistor having a source, a gate, and a drain, the gate of said first bias transistor being coupled to the gate of said first cascode transistor; a second bias transistor having a source, a gate, and a drain, the gate of said second bias transistor being coupled to the gate of said second cascode transistor, and the drain of said second bias transistor being coupled to the gate of said first bias transistor; and a differential transistor pair having a common source node coupled to a current source, a first gate node for a first polarity component of an input signal, a second gate node for a second polarity component of said input signal, a first drain node, and a second drain node coupled to the drain of said second bias transistor. The electronic circuit may further include a third cascode transistor having a source, a gate, and a drain, the drain of said third cascode transistor being coupled to the gate of said first output driver transistor; and a fourth cascode transistor having a source, a gate, and a drain, the drain of said fourth cascode transistor being coupled to the gate of said second output driver transistor. The electronic circuit may further include a third bias transistor having a source, a gate, and a drain, the gate of said third bias transistor being coupled to the gate of said third cascode transistor; and a fourth bias transistor having a source, a gate, and a drain, the gate of said fourth bias transistor being coupled to the gate of said fourth cascode transistor, and the drain of said fourth bias transistor being coupled to the gate of said third bias transistor. The first output driver transistor, said third cascode transistor, said fourth cascode transistor, said third bias transistor, and said fourth bias transistor may be NMOS transistors; and said second output driver transistor, said first cascode transistor, said second cascode transistor, said first bias transistor, and said second bias transistor may be NMOS transistors. The differential transistor pair may include a first PMOS input transistor having a source, a gate, and a drain; and a second PMOS input transistor having a source, a gate, and a drain; wherein the source of said first PMOS input transistor and the source of said second PMOS input transistor are coupled to said common source node; the gate of said first PMOS input transistor corresponds to said first gate node; the gate of said second PMOS input transistor corresponds to said second gate node; the drain of said first PMOS input transistor corresponds to said first drain node; and the drain of said second PMOS input transistor corresponds to said second drain node. The electronic circuit may comprise an operational amplifier; and said electronic circuit may further comprise an output node coupled to the drain of said first output driver transistor and coupled to the drain of said second output driver transistor.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:
1. A class A/B amplifier output stage comprising:
a first output driver transistor having a source, a gate, and a drain;
a second output driver transistor having a source, a gate, and a drain, the drain of said first output driver transistor being coupled to the drain of said second output driver transistor;
a first high swing cascode structure coupled to said first output driver transistor and to said second output driver transistor;
a second high swing cascode structure coupled to said first output driver transistor and to said second output driver transistor; and
a voltage source coupled to said first high swing cascode structure, said voltage source providing a minimum operating voltage of about 3VDS$_{sat}$, where VDS$_{sat}$ is the drain-to-source voltage at saturation for said first output driver transistor and said second output driver transistor, and wherein said first high swing cascode structure and said second high swing cascode structure bias said first output driver transistor to its subthreshold operating region, and bias said second output driver transistor to its subthreshold operating region.

2. A class A/B amplifier output stage according to claim 1, wherein:
said voltage source provides an operating voltage of VDD, and overdrive voltage for said first and second output driver transistors is about VDD-VT-2VDS$_{sat}$, where VT is the threshold voltage for said first and second output driver transistors.

3. A class A/B amplifier output stage according to claim 1, further comprising a biasing architecture coupled to said first high swing cascode structure and said second high swing cascode structure, wherein:
said first high swing cascode structure comprises a first plurality of cascode transistors;
said second high swing cascode structure comprises a second plurality of cascode transistors; and
said biasing architecture biases each of said first plurality of cascode transistors and each of said second plurality of cascode transistors into its respective subthreshold operating region.

4. A class A/B amplifier output stage according to claim 1, further comprising:
a first current mirror structure coupled to said first high swing cascode structure; and
a second current mirror structure coupled to said second high swing cascode structure.

5. A class A/B amplifier output stage according to claim 4, wherein:
said first current mirror structure comprises a first current mirror transistor having a source, a gate, and a drain, and a second current mirror transistor having a source, a gate, and a drain, the gate of said first current mirror transistor being coupled to the drain of said second current mirror transistor; and
said second current mirror structure comprises a third current mirror transistor having a source, a gate, and a drain, and a fourth current mirror transistor having a source, a gate, and a drain, the gate of said fourth current mirror transistor being coupled to the drain of said third current mirror transistor.

6. A class A/B amplifier output stage comprising:
a PMOS output driver transistor having a source, a gate, and a drain;
an NMOS output driver transistor having a source, a gate, and a drain, the drain of said PMOS output driver transistor being coupled to the drain of said NMOS output driver transistor;
a first PMOS cascode transistor having a source, a gate, and a drain, the drain of said first PMOS cascode transistor being coupled to the gate of said PMOS output driver transistor;

a first NMOS cascode transistor having a source, a gate, and a drain, the drain of said first NMOS cascode transistor being coupled to the gate of said NMOS output driver transistor;

a final PMOS cascode transistor having a source, a gate, and a drain, the drain of said final PMOS cascode transistor being coupled to the gate of said NMOS output driver transistor;

a final NMOS cascode transistor having a source, a gate, and a drain, the drain of said final NMOS cascode transistor being coupled to the gate of said PMOS output driver transistor;

a first PMOS bias transistor having a source, a gate, and a drain, the gate of said first PMOS bias transistor being coupled to the gate of said first PMOS cascode transistor;

a first NMOS bias transistor having a source, a gate, and a drain, the gate of said first NMOS bias transistor being coupled to the gate of said first NMOS cascode transistor;

a final PMOS bias transistor having a source, a gate, and a drain, the gate of said final PMOS bias transistor being coupled to the gate of said final PMOS cascode transistor, and the drain of said final PMOS bias transistor being coupled to the gate of said first PMOS bias transistor; and a final NMOS bias transistor having a source, a gate, and a drain, the gate of said final NMOS bias transistor being coupled to the gate of said final NMOS cascode transistor, and the drain of said final NMOS bias transistor being coupled to the gate of said first NMOS bias transistor.

7. The class A/B amplifier output stage of claim 6, wherein:

the source of said PMOS output driver transistor is coupled to a supply voltage;

the source of said first PMOS cascode transistor is coupled to said supply voltage;

the source of said first PMOS bias transistor is coupled to said supply voltage;

the source of said NMOS output driver transistor is coupled to a ground potential;

the source of said first NMOS cascode transistor is coupled to said ground potential; and the source of said first NMOS bias transistor is coupled to said ground potential.

8. The class A/B amplifier output stage of claim 6, wherein the drain of said first PMOS cascode transistor is coupled to the source of said final PMOS cascode transistor; and the drain of said first NMOS cascode transistor is coupled to the source of said final NMOS cascode transistor.

9. The class A/B amplifier output stage of claim 6, wherein the drain of said first PMOS bias transistor is coupled to the source of said final PMOS bias transistor; and the drain of said first NMOS bias transistor is coupled to the source of said final NMOS bias transistor.

10. The class A/B amplifier output stage of claim 6, further comprising:

a first current source coupled to said final PMOS bias transistor, said first current source providing a first bias current for said first PMOS bias transistor and for said final PMOS bias transistor; and a second current source coupled to said final NMOS bias transistor, said second current source providing a second bias current for said first NMOS bias transistor and for said final NMOS bias transistor.

11. The class A/B amplifier output stage according to claim 10, wherein said first bias current is equal to said second bias current.

12. A class A/B amplifier output stage according to claim 6, further comprising:

an additional PMOS cascode transistor having a source, a gate, and a drain, the source of said additional PMOS cascode transistor being coupled to the drain of said first PMOS cascode transistor, and the drain of said additional PMOS cascode transistor being coupled to the source of said final PMOS cascode transistor; and an additional NMOS cascode transistor having a source, a gate, and a drain, the source of said additional NMOS cascode transistor being coupled to the drain of said first NMOS cascode transistor, and the drain of said additional NMOS cascode transistor being coupled to the source of said final NMOS cascode transistor.

13. A class A/B amplifier output stage according to claim 12, further comprising:

an additional PMOS bias transistor having a source, a gate, and a drain, the source of said additional PMOS bias transistor being coupled to the drain of said first PMOS bias transistor, the gate of said additional PMOS bias transistor being coupled to the gate of said additional PMOS cascode transistor, and the drain of said additional PMOS bias transistor being coupled to the source of said final PMOS bias transistor; and an additional NMOS bias transistor having a source, a gate, and a drain, the source of said additional NMOS bias transistor being coupled to the drain of said first NMOS bias transistor, the gate of said additional NMOS bias transistor being coupled to the gate of said additional NMOS cascode transistor, and the drain of said additional NMOS bias transistor being coupled to the source of said final NMOS bias transistor.

14. An electronic circuit comprising:

a first output driver transistor having a source, a gate, and a drain;

a second output driver transistor having a source, a gate, and a drain, the drain of said first output driver transistor being coupled to the drain of said second output driver transistor;

a first cascode transistor having a source, a gate, and a drain, the drain of said first cascode transistor being coupled to the gate of said second output driver transistor;

a second cascode transistor having a source, a gate, and a drain, the drain of said second cascode transistor being coupled to the gate of said first output driver transistor;

a first bias transistor having a source, a gate, and a drain, the gate of said first bias transistor being coupled to the gate of said first cascode transistor;

a second bias transistor having a source, a gate, and a drain, the gate of said second bias transistor being coupled to the gate of said second cascode transistor, and the drain of said second bias transistor being coupled to the gate of said first bias transistor; and a differential transistor pair having a common source node coupled to a current source, a first gate node for a first polarity component of an input signal, a second gate node for a second polarity component of said input signal, a first drain node, and a second drain node coupled to the drain of said second bias transistor.

15. The electronic circuit of claim 14, further comprising:
a third cascode transistor having a source, a gate, and a drain, the drain of said third cascode transistor being coupled to the gate of said first output driver transistor; and
a fourth cascode transistor having a source, a gate, and a drain, the drain of said fourth cascode transistor being coupled to the gate of said second output driver transistor.

16. The electronic circuit of claim 15, further comprising:
a third bias transistor having a source, a gate, and a drain, the gate of said third bias transistor being coupled to the gate of said third cascode transistor; and
a fourth bias transistor having a source, a gate, and a drain, the gate of said fourth bias transistor being coupled to the gate of said fourth cascode transistor, and the drain of said fourth bias transistor being coupled to the gate of said third bias transistor.

17. The electronic circuit of claim 16, wherein said first output driver transistor, said third cascode transistor, said fourth cascode transistor, said third bias transistor, and said fourth bias transistor are NMOS transistors; and said second output driver transistor, said first cascode transistor, said second cascode transistor, said first bias transistor, and said second bias transistor are NMOS transistors.

18. The electronic circuit of claim 17, wherein said differential transistor pair comprises:
a first PMOS input transistor having a source, a gate, and a drain; and
a second PMOS input transistor having a source, a gate, and a drain; wherein
the source of said first PMOS input transistor and the source of said second PMOS input transistor are coupled to said common source node;
the gate of said first PMOS input transistor corresponds to said first gate node;
the gate of said second PMOS input transistor corresponds to said second gate node;
the drain of said first PMOS input transistor corresponds to said first drain node; and
the drain of said second PMOS input transistor corresponds to said second drain node.

19. The electronic circuit of claim 14, wherein said electronic circuit comprises an operational amplifier; and
said electronic circuit further comprises an output node coupled to the drain of said first output driver transistor and coupled to the drain of said second output driver transistor.

* * * * *